(12) United States Patent
Ohno et al.

(10) Patent No.: US 11,601,055 B2
(45) Date of Patent: Mar. 7, 2023

(54) WIRELESS COMMUNICATION MODULE

(71) Applicant: Murata Manufacturing Co., Ltd., Kyoto-fu (JP)

(72) Inventors: Akihiro Ohno, Nagaokakyo (JP); Yu Ishiwata, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 103 days.

(21) Appl. No.: 17/072,667

(22) Filed: Oct. 16, 2020

(65) Prior Publication Data

US 2021/0036409 A1 Feb. 4, 2021

Related U.S. Application Data

(63) Continuation of application No. PCT/JP2019/015150, filed on Apr. 5, 2019.

(30) Foreign Application Priority Data

Apr. 26, 2018 (JP) .............................. JP2018-084784

(51) Int. Cl.
*H02M 3/158* (2006.01)
*H01Q 5/371* (2015.01)
(Continued)

(52) U.S. Cl.
CPC ............ *H02M 3/158* (2013.01); *H01Q 1/243* (2013.01); *H01Q 5/371* (2015.01); *H01Q 9/0421* (2013.01); *H02M 1/32* (2013.01); *H02M 1/007* (2021.05)

(58) Field of Classification Search
CPC ...... H01Q 1/243; H01Q 5/371; H02M 1/4225
See application file for complete search history.

(56) References Cited

U.S. PATENT DOCUMENTS

2009/0279456 A1* 11/2009 Lee ...................... H04L 25/0272
370/279
2010/0194475 A1* 8/2010 Okayama ................. H04B 1/18
330/151

(Continued)

FOREIGN PATENT DOCUMENTS

| JP | 2004187446 A | 7/2004 |
| JP | 2004364394 A | 12/2004 |
| WO | 2017163481 A1 | 9/2017 |

OTHER PUBLICATIONS

International Search Report issued in PCT/JP2019/015150; dated Jun. 4, 2019.

(Continued)

*Primary Examiner* — Wei (Victor) Y Chan
(74) *Attorney, Agent, or Firm* — Studebaker & Brackett PC (57) ABSTRACT

A power supply circuit includes a switching element coupled in a current path between an input terminal and an output terminal and includes a smoothing capacitor coupled between the output terminal and a ground. A bypass capacitor is coupled between the input terminal and the ground. An antenna element shares the ground with the power supply circuit. A frequency filter having a stop band that is an operating frequency band of the antenna element is inserted in series in at least either a current path between the switching element and the smoothing capacitor or a current path between the bypass capacitor and the switching element. It is possible to suppress deterioration of wireless communication quality due to noise caused in a DC-DC converter.

17 Claims, 6 Drawing Sheets

(51) Int. Cl.
*H01Q 1/24* (2006.01)
*H01Q 9/04* (2006.01)
*H02M 1/32* (2007.01)
*H02M 1/00* (2006.01)

(56) References Cited

U.S. PATENT DOCUMENTS

2013/0154868 A1* 6/2013 Kehrer .................. H04B 1/18
 342/16
2016/0006476 A1* 1/2016 El-Rayis ................ H04B 1/48
 455/78

OTHER PUBLICATIONS

International Preliminary Report on Patentability and Written Opinion issued in PCT/JP2019/015150; dated Oct. 27, 2020.

* cited by examiner

WIRELESS COMMUNICATION MODULE

CROSS-REFERENCE TO RELATED APPLICATIONS

This application claims benefit of priority to International Patent Application No. PCT/JP2019/015150, filed Apr. 5, 2019, and to Japanese Patent Application No. 2018-084784, filed Apr. 26, 2018, the entire contents of each are incorporated herein by reference.

BACKGROUND

Technical Field

The present disclosure relates to a wireless communication module.

Background Art

Japanese Unexamined Patent Application Publication No. 2004-187446 indicated below discloses a DC-DC converter that supplies direct current (DC) power to a power amplifier used in a transmit circuit for wireless communication. A band-stop filter corresponding to a frequency range of the difference between the transmit frequency band and the receive frequency band is provided at the output section of the DC-DC converter. By providing the band-stop filter, the influence of noise on the reception frequency band due to the transmission power of the transmit circuit is suppressed.

SUMMARY

Usually, a method is used in which a smoothing capacitor of a capacitance of several tens of µF or higher is coupled to the output section of a DC-DC converter to reduce noise over a wide frequency range. When this method is used, noise components leaking from the output section of the DC-DC converter to the outside are caused to flow to the ground, and as a result, noise can be reduced. However, according to the study conducted by the inventors of the present application, it has been found that the method of causing noise components to flow to the ground does not necessarily achieve a sufficient noise reduction effect.

Ringing noise caused by switching of the DC-DC converter appears in the frequency band up to the several GHz band. The noise in the several GHz band flows into the ground through the stray capacitance of the substrate, the smoothing capacitor, and the like. In addition, an inverted F antenna or a planar inverted F antenna that is suitable for downsizing and that can improve radiation efficiency is often used for wireless earphones, IoT devices, and the like. The inverted F antenna or the planar inverted F antenna is coupled to the ground. When the noise caused in the DC-DC converter is transferred directly to the antenna via the ground, the quality of wireless communication is degraded.

A low-power wide-area (LPWA) communication system typified by WiFi or a personal area network (PAN) typified by Bluetooth (registered trademark) is used by wireless earphones and IoT devices. The printed boards of these devices are smaller than the printed boards of smart phones and the like, and thus, it is difficult to secure a sufficiently large ground. Furthermore, the distance between the noise source and the antenna for wireless communication is short. As described above, when it is difficult to secure a sufficiently large ground, the noise flowing into the ground greatly affects the antenna.

Accordingly, the present disclosure provides a wireless communication module that suppresses deterioration of wireless communication quality due to noise generated in a DC-DC converter.

According to an aspect of the present disclosure, provided is a wireless communication module having a DC-DC converter including a switching element coupled in a current path between an input terminal and an output terminal and including a smoothing capacitor coupled between the output terminal and a ground, a bypass capacitor coupled between the input terminal and the ground, an antenna element sharing the ground with the DC-DC converter, and a frequency filter inserted in series in at least either a current path between the switching element and the smoothing capacitor or a current path between the bypass capacitor and the switching element and having a stop band that is an operating frequency band of the antenna element.

The frequency filter reduces the noise flowing into the ground through the smoothing capacitor or the bypass capacitor, and thus, it is possible to reduce the noise transferred to the antenna via the ground.

DETAILED DESCRIPTION

First Embodiment

A wireless communication module according to a first embodiment will be described with reference to FIGS. 1 to 5.

Figure 1:
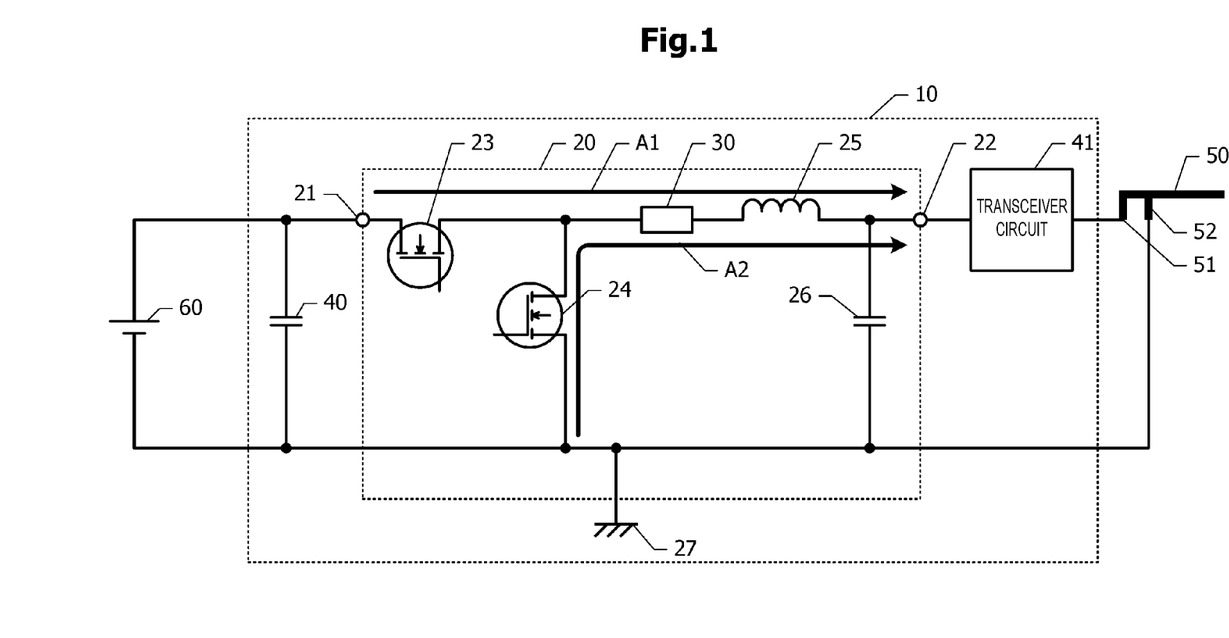
FIG. 1 is an equivalent circuit diagram of a wireless communication module according to a first embodiment.

FIG. 1 is an equivalent circuit diagram of a wireless communication module 10 according to the first embodiment. The wireless communication module 10 according to the first embodiment includes a power supply circuit 20 using a DC-DC converter, a frequency filter 30, a bypass capacitor 40, a transceiver circuit 41, and an antenna element 50. The power supply circuit 20 includes an input terminal 21, an output terminal 22, and a ground 27. The bypass capacitor 40 is coupled between the input terminal 21 and the ground 27. A DC power supply 60 is coupled between the input terminal 21 and the ground.

The DC voltage outputted from the output terminal 22 of the power supply circuit 20 is applied to the transceiver circuit 41. The transceiver circuit 41 transmits a high frequency signal to the antenna element 50. The antenna element 50 is, for example, an inverted F antenna or a planar inverted F antenna and a feed point of the antenna element 50 is coupled to the transceiver circuit 41 (the IC and part of peripheral components). The antenna element 50 shares the ground with the power supply circuit 20. For example, a short line 52 of the antenna element 50 is coupled to the same ground as the ground 27 of the power supply circuit 20.

The transceiver circuit 41 includes, for example, a baseband circuit, a modulation/demodulation circuit, a band pass filter, a diplexer, a power amplifier, a low-noise amplifier, and the like.

Next, the configuration of the power supply circuit 20 will be described. The power supply circuit 20 mainly has two current paths A1 and A2. The current path A1 starts from the input terminal 21 and reaches the output terminal 22 via a switching element 23 and an output inductor 25. The other current path A2 starts from the ground 27 and reaches the output terminal 22 via another switching element 24 and the output inductor 25. A smoothing capacitor 26 is coupled between the output terminal 22 and the ground 27. Instead of the switching element 24, a diode in which the forward direction is a direction from the ground 27 to the output inductor 25 may be used. The DC-DC converter including the switching elements 23 and 24 is a DC-DC buck converter.

In the current path A1 from the input terminal 21 to the output terminal 22, the frequency filter 30 is coupled in series to the current path on the switching element 23 side with respect to the connection point of the smoothing capacitor 26. The frequency filter 30 is a band-stop filter in which the operating frequency band of the antenna element 50 is a stop band. FIG. 1 illustrates an example in which the frequency filter 30 is inserted in the current path A1 between the switching element 23 and the output inductor 25.

When the switching element 23 and the other switching element 24 are alternately turned on and off, the DC voltage inputted to the input terminal 21 is stepped down and outputted from the output terminal 22.

Figure 2A:
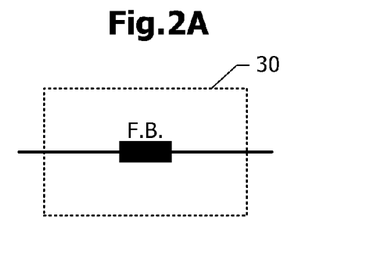
FIGS. 2A and 2B are equivalent circuit diagrams illustrating examples of a frequency filter.
Figure 2B:
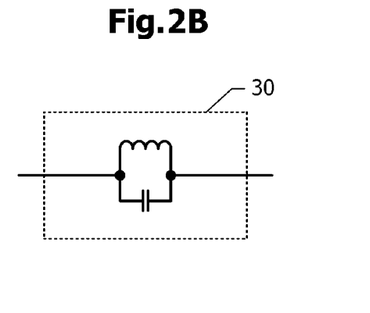

FIG. 2A is an equivalent circuit diagram illustrating an example of the frequency filter 30. A ferrite bead (F.B.) can be used as the frequency filter 30. FIG. 2B is an equivalent circuit diagram illustrating another example of the frequency filter 30. An LC parallel resonant circuit can be used as the frequency filter 30. The LC parallel resonant circuit reflects a part of the signal in the frequency range near the resonant frequency. The ferrite bead attenuates the signal of a frequency in the stop band by converting the signal into heat. In the case in which the influence of the reflected wave cannot be ignored, it is preferable to use a ferrite bead as the frequency filter 30.

Next, an excellent effect obtained by using the configuration of the wireless communication module according to the first embodiment will be described.

When the switching elements 23 and 24 are switched on and off, spike noise and ringing noise occur. Spike noise and ringing noise is transferred from the output terminal 22 to the transceiver circuit 41, and thus, a noise filter such as a ferrite bead is inserted usually between the output terminal 22 and the transceiver circuit 41.

According to the study conducted by the inventors of the present application, it has been found that, in addition to noise leaking from the output terminal 22 to the outside, noise flowing into the ground 27 through the smoothing capacitor 26 and the stray capacitance of the substrate may be transmitted to the antenna element 50, and as a result, wireless communication may be inhibited. In particular, when the antenna element 50 shares the ground with the power supply circuit 20, the antenna element 50 is easily affected by noise flowing into the ground 27 of the power supply circuit 20.

In the first embodiment, the ringing noise caused due to switching of the switching elements 23 and 24 is attenuated or reflected by the frequency filter 30, and as a result, it is possible to reduce the noise flowing into the ground 27 through the smoothing capacitor 26. Accordingly, it is possible to suppress deterioration of quality of communication using the antenna element 50. The stop band of the frequency filter 30 can be set to the operating frequency band of the antenna element 50. When the antenna element 50 operates in the 2.4 GHz band, the stop band of the frequency filter 30 may be set to the 2.4 GHz band; when the antenna element 50 operates in the 5 GHz band, the stop band of the frequency filter 30 may be set to the 5 GHz band.

Next, with reference to the drawings of FIGS. 3 to 5, the result of the evaluation experiment performed to observe the noise suppressing effect in the wireless communication module according to the first embodiment will be described.

The noise coupled to the antenna element 50 during WiFi search is measured in the state in which the transceiver circuit 41 (FIG. 1) is disconnected from a feed point 51 (FIG. 1) of the antenna element 50 and the power supply circuit 20 operates in a shield box. The evaluation experiment was conducted with respect to three kinds of configurations: a configuration in which the frequency filter 30 is not inserted, a configuration in which a 15 nH inductor is used as the frequency filter 30, and a configuration in which a ferrite bead is used as the frequency filter 30. The antenna element 50 used was one that operates in the 2.4 GHz band.

Figure 3:
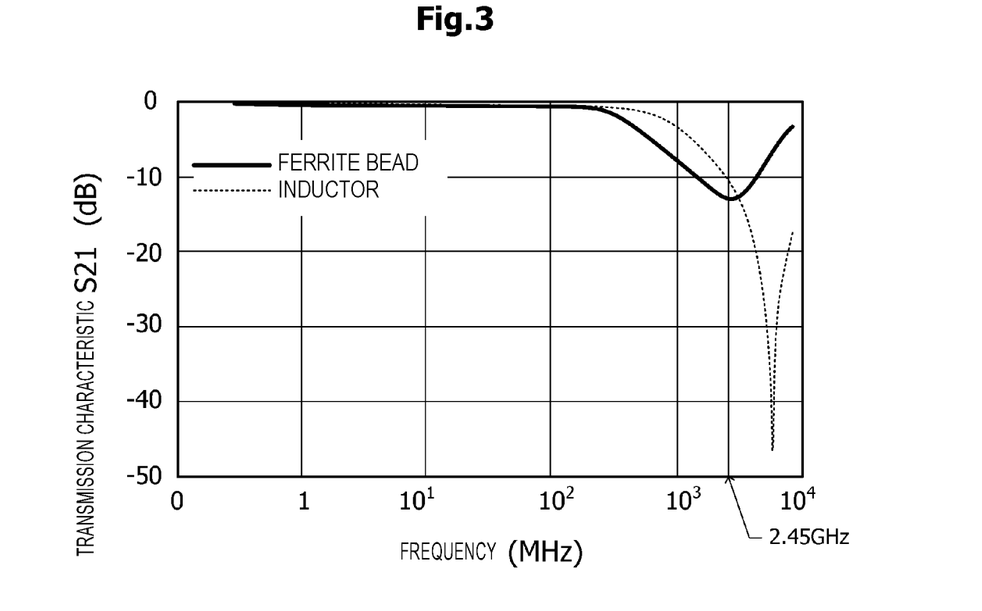
FIG. 3 is a graph illustrating the transmission characteristic S21 of each of an inductor and a ferrite bead used in an evaluation experiment.

FIG. 3 is a graph illustrating the transmission characteristic S21 of each of the inductor and the ferrite bead used in the evaluation experiment. The horizontal axis represents the frequency in the unit of "MHz" and the vertical axis represents the transmission characteristic S21 in the unit of "dB". The transmission characteristic S21 indicated in FIG. 3 is measured by using a measurement system of a 50 n characteristic impedance. The solid line and the dashed line in the graph of FIG. 3 respectively indicate the transmission characteristics S21 of the ferrite bead and the inductor. As the inductor, one with a resonance point at 6 GHz, which is determined in accordance with inductance and stray capacitance, was used. As the ferrite bead, one with the 2.4 GHz stop band was used.

Figure 4:
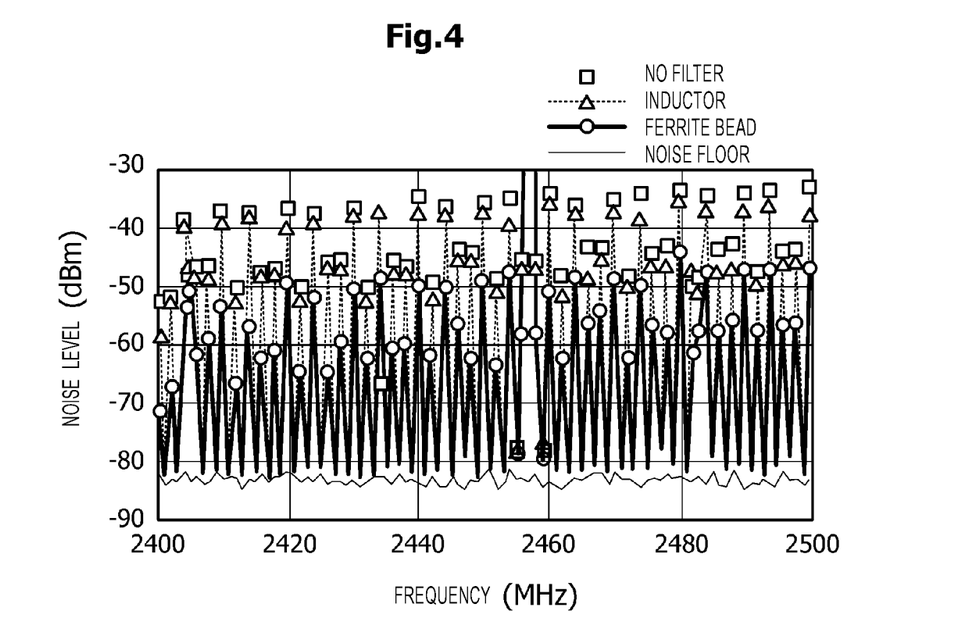
FIG. 4 is a graph illustrating a result obtained by measuring spectrums of noise coupled to an antenna element with the use of a spectrum analyzer connected through a coaxial cable in the evaluation experiment.

FIG. 4 is a graph illustrating spectrums of noise coupled to the antenna element 50 (FIG. 1). The horizontal axis represents the frequency in the unit of "MHz" and the vertical axis represents the noise level in the unit of "dBm". The square symbols in the graph of FIG. 4 indicate noise levels in the case in which the frequency filter 30 (FIG. 1) is not inserted. The triangle symbol and the dashed line indicate noise levels in the case in which an inductor is used as the frequency filter 30. The circle symbols and the solid line indicate noise levels in the case in which a ferrite bead is used as the frequency filter 30. The high noise level appearing near the frequency of 2455 MHz is caused by signals for WiFi search. The thin solid line illustrated in the graph of FIG. 4 indicates the noise floor.

Figure 5:
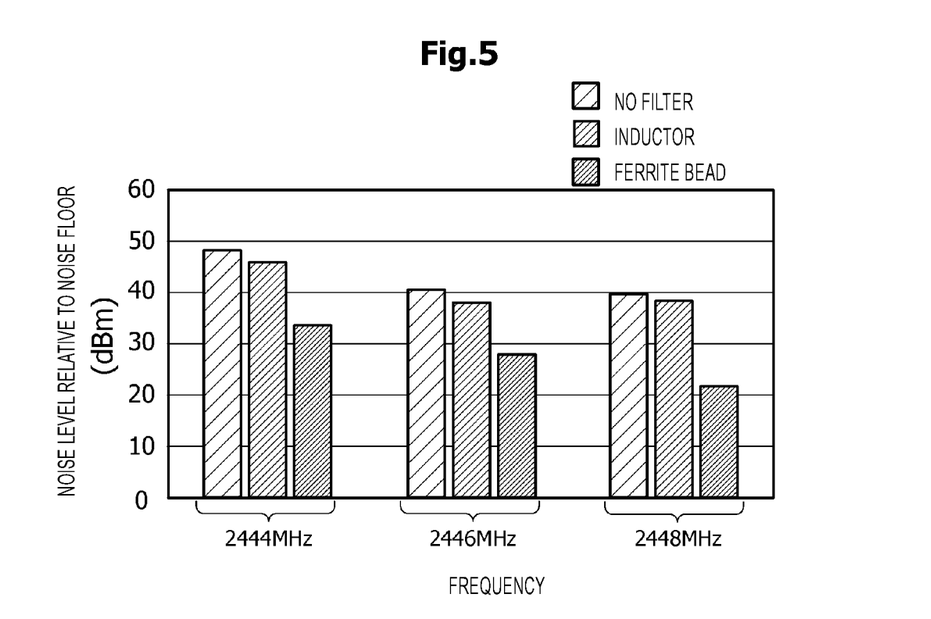
FIG. 5 is a bar graph illustrating noise levels at frequencies of 2444 MHz, 2446 MHz, and 2448 MHz extracted from the noise level spectrums illustrated in FIG. 4.

FIG. 5 is a bar graph illustrating noise levels at frequencies of 2444 MHz, 2446 MHz, and 2448 MHz extracted from the noise level spectrums illustrated in FIG. 4. The vertical axis in FIG. 5 represents the noise level relative to the noise floor.

As seen in FIGS. 4 and 5, when a ferrite bead is used as the frequency filter 30, the noise level is lower than that in the case in which the frequency filter 30 is not inserted and in the case in which an inductor is used as the frequency filter 30.

According to the evaluation experiment described above, it was confirmed that it is possible to reduce the noise coupled to the antenna element 50 by using the frequency filter 30 in which the stop band is the operating frequency band of the antenna element 50.

Second Embodiment

Next, the wireless communication module 10 according to a second embodiment will be described with reference to FIG. 6. Hereinafter, description of the configuration common to the wireless communication module according to the first embodiment will be omitted.

Figure 6:
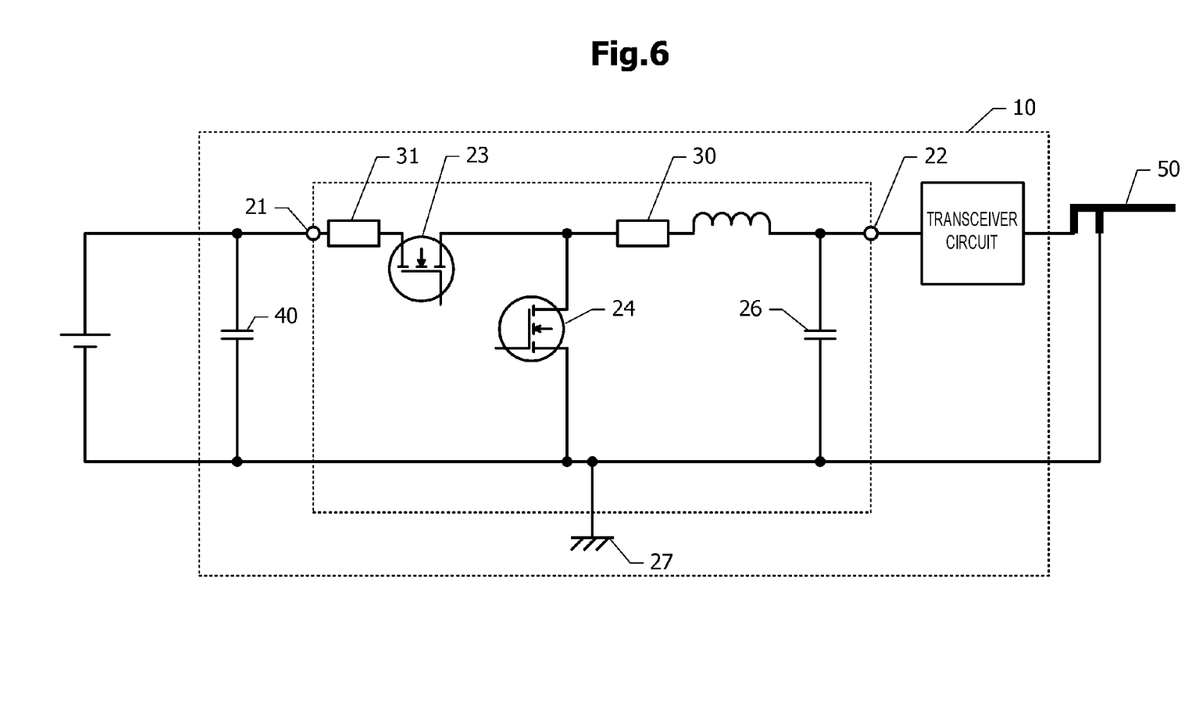
FIG. 6 is an equivalent circuit diagram of a wireless communication module according to a second embodiment.

FIG. 6 is an equivalent circuit diagram of the wireless communication module 10 according to the second embodiment. In the first embodiment, the frequency filter 30 is inserted in the current path on the output side with respect to the switching element 23; and on the input side, the switching element 23 is directly coupled to the bypass capacitor 40. In the second embodiment, a frequency filter 31 on the input side is coupled in series between the bypass capacitor 40 and the switching element 23 (between the bypass capacitor 40 and the input terminal 21). The frequency filter 31 on the input side has the same filter characteristic as that of the frequency filter 30 on the output side.

Next, an excellent effect obtained by connecting the frequency filter 31 on the input side will be described. When the switching element 23 is switched on and off, noise is generated also on the input terminal 21 side due to the equivalent series inductance (ESL) and the like of the bypass capacitor 40. Also, noise is generated by switching the switching element 24. In the wireless communication module according to the second embodiment, the frequency filter 31 is inserted also on the input terminal 21 side, and as a result, it is possible to inhibit the propagation of noise generated on the input terminal 21 side and transferred to the antenna element 50 via the bypass capacitor 40 and the ground 27.

Next, a modified example of the second embodiment will be described. In the second embodiment, the frequency filter 30 is inserted on the output side with respect to the switching element 23 and the other frequency filter 31 is inserted on the input side. In this modified example, the frequency filter 30 on the output side is removed and the frequency filter 31 is coupled only on the input side. As such, a frequency filter may be inserted in series in at least either the current path between the switching element 23 and the smoothing capacitor 26 or the current path between the switching element 23 and the bypass capacitor 40. By inserting a frequency filter on at least one side, noise coupled to the antenna element 50 via the ground 27 can be reduced.

Third Embodiment

Next, the wireless communication module 10 according to a third embodiment will be described with reference to FIG. 7. Hereinafter, description of the configuration common to the wireless communication module (FIG. 6) according to the second embodiment will be omitted.

Figure 7:
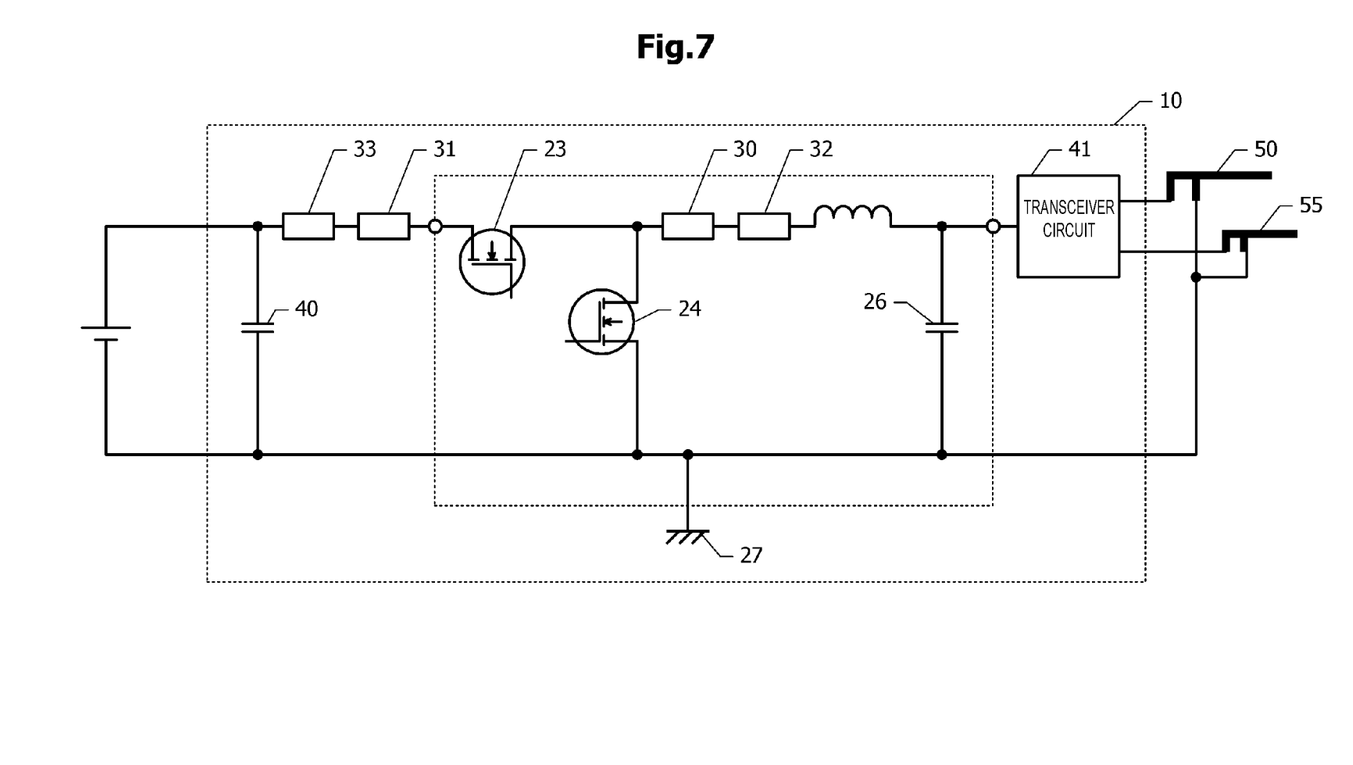
FIG. 7 is an equivalent circuit diagram of a wireless communication module according to a third embodiment.

FIG. 7 is an equivalent circuit diagram of the wireless communication module 10 according to the third embodiment. The wireless communication module 10 according to the second embodiment has the one antenna element 50. The wireless communication module 10 according to the third embodiment includes, in addition to the antenna element 50, an antenna element 55 that operates in another frequency band. For example, the one antenna element 50 operates in the 2.4 GHz band and the other antenna element 55 operates in the 5 GHz band. The transceiver circuit 41 transmits and receives signals in two frequency bands. The transceiver circuit 41 includes a baseband circuit and a high frequency circuit (RF circuit), in which the baseband circuit and the high frequency circuit are both coupled to a duplexer (separator).

In addition to the frequency filter 30, another frequency filter 32 is coupled in series in the current path between the switching element 23 and the smoothing capacitor 26. The stop bands of the frequency filters 30 and 32 are the respective operating frequency bands of the antenna elements 50 and 55. In addition to the frequency filter 31, another frequency filter 33 is coupled in series in the current path between the switching element 23 and the bypass capacitor 40. The stop bands of the frequency filters 31 and 33 are the respective operating frequency bands of the antenna elements 50 and 55.

Next, an excellent effect obtained by using the configuration of the wireless communication module 10 according to the third embodiment will be described. The wireless communication module 10 according to the third embodiment can perform wireless communication in two frequency bands. Furthermore, in the two frequency bands, it is possible to reduce the noise flowing into the antenna elements 50 and 55 through the ground 27.

Fourth Embodiment

Next, a wireless communication module according to a fourth embodiment will be described with reference to FIGS. 8A and 8B. Hereinafter, description of the configuration common to the wireless communication module (FIG. 1) according to the first embodiment will be omitted.

Figure 8A:
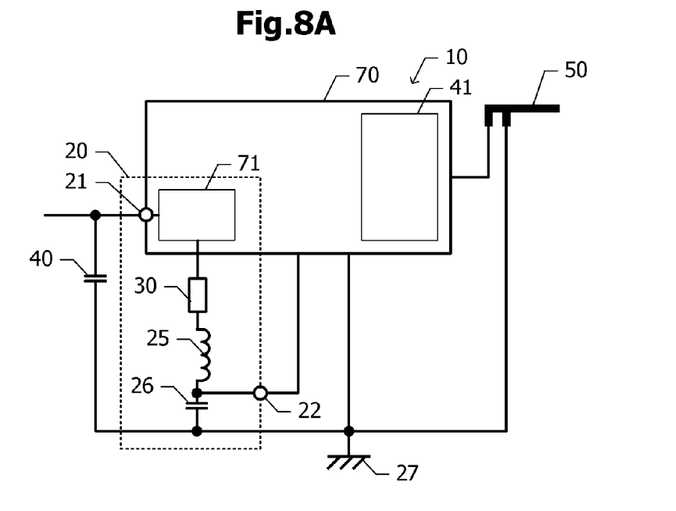
FIGS. 8A and 8B are equivalent circuit diagrams of wireless communication modules according to a fourth embodiment and a modified example.

FIG. 8A is an equivalent circuit diagram of the wireless communication module 10 according to the fourth embodiment. In the wireless communication module 10 according to the fourth embodiment, a switching circuit 71 forming a part of the power supply circuit 20 (FIG. 1) and a WiFi module 70 including the transceiver circuit 41 are used. The power supply circuit 20 includes the switching circuit 71 included in the WiFi module 70, the external output inductor 25, and the smoothing capacitor 26. The frequency filter 30 is coupled in series between the switching circuit 71 and the output inductor 25.

An external power supply terminal of the WiFi module 70 serves as the input terminal 21 of the power supply circuit 20. The bypass capacitor 40 is coupled between the input terminal 21 and the ground 27. The DC voltage outputted from the output terminal 22 of the power supply circuit 20 is inputted to the WiFi module 70.

Figure 8B:
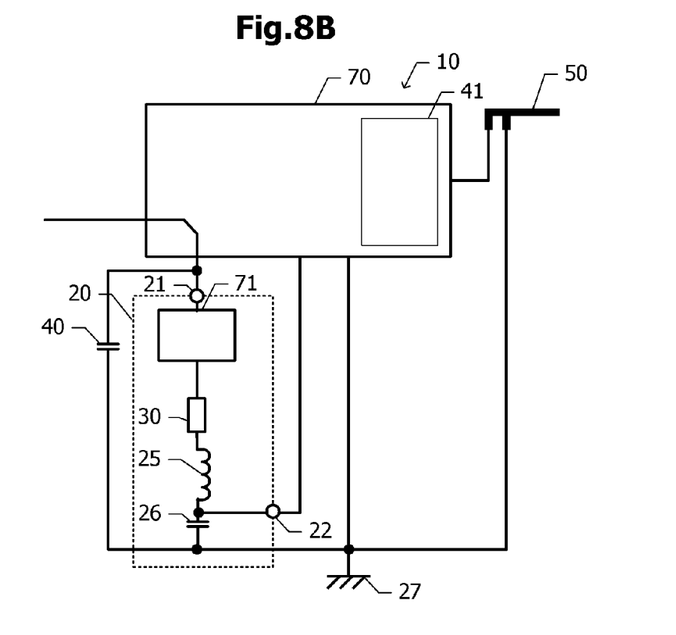

FIG. 8B is an equivalent circuit diagram of the wireless communication module 10 according to a modified example of the fourth embodiment. In this modified example, the WiFi module 70 not including the power supply circuit 20 is used. The switching circuit 71, the output inductor 25, and the smoothing capacitor 26 of the power supply circuit 20 are externally coupled outside the WiFi module 70. The DC voltage applied to the external power supply terminal of the WiFi module 70 is applied to the input terminal 21 of the external power supply circuit 20. Also in this modified example, the frequency filter 30 is coupled in series between the switching circuit 71 and the output inductor 25.

As illustrated in FIGS. 8A and 8B, the frequency filter 30 can be externally coupled to the WiFi module 70 together with the output inductor 25 and the smoothing capacitor 26. By externally coupling the frequency filter 30, it is possible to suppress deterioration of wireless communication quality due to the noise flowing into the ground 27, similarly to the case of the first embodiment.

The embodiments described above are mere examples, and as might be expected, the configurations described in the different embodiments may be partially replaced or combined with each other. In particular, almost identical effects and advantages achieved by almost identical configurations of the embodiments are not mentioned in every embodiment. Furthermore, the present disclosure is not limited to the embodiments described above. For example, it will be apparent to those skilled in the art that various modifications, improvements, combinations, and the like can be made.

What is claimed is:

1. A wireless communication module comprising:
    a power supply circuit including a switching element coupled in a current path between an input terminal and an output terminal, and including a smoothing capacitor coupled between the output terminal and a ground;
    a bypass capacitor coupled between the input terminal and the ground;
    an antenna element sharing the ground with the power supply circuit; and
    a frequency filter inserted in series in at least either a current path between the switching element and the smoothing capacitor or a current path between the bypass capacitor and the switching element and having a stop band that is an operating frequency band of the antenna element, wherein
    the smoothing capacitor is connected between the output terminal and the ground such that the smoothing capacitor smooths an AC signal of the output terminal.

2. The wireless communication module according to claim 1, wherein
    the frequency filter includes either a ferrite bead or an LC parallel resonant circuit.

3. The wireless communication module according to claim 1, wherein
    the antenna element is an inverted F antenna or a planar inverted F antenna with a short line coupled to the ground common to the power supply circuit.

4. The wireless communication module according to claim 1, wherein
    the stop band of the frequency filter is either a 2.4 GHz band or a 5 GHz band.

5. The wireless communication module according to claim 1, further comprising:
    another frequency filter inserted in series in a current path in which the frequency filter is not inserted, the current path being either the current path between the switching element and the smoothing capacitor or the current path between the bypass capacitor and the switching element, and having a stop band that is the operating frequency band of the antenna element.

6. The wireless communication module according to claim 2, wherein
    the antenna element is an inverted F antenna or a planar inverted F antenna with a short line coupled to the ground common to the power supply circuit.

7. The wireless communication module according to claim 2, wherein
    the stop band of the frequency filter is either a 2.4 GHz band or a 5 GHz band.

8. The wireless communication module according to claim 3, wherein
    the stop band of the frequency filter is either a 2.4 GHz band or a 5 GHz band.

9. The wireless communication module according to claim 6, wherein
    the stop band of the frequency filter is either a 2.4 GHz band or a 5 GHz band.

10. The wireless communication module according to claim 2, further comprising:
    another frequency filter inserted in series in a current path in which the frequency filter is not inserted, the current path being either the current path between the switching element and the smoothing capacitor or the current path between the bypass capacitor and the switching element, and having a stop band that is the operating frequency band of the antenna element.

11. The wireless communication module according to claim 3, further comprising:
    another frequency filter inserted in series in a current path in which the frequency filter is not inserted, the current path being either the current path between the switching element and the smoothing capacitor or the current path between the bypass capacitor and the switching element, and having a stop band that is the operating frequency band of the antenna element.

12. The wireless communication module according to claim 4, further comprising:
    another frequency filter inserted in series in a current path in which the frequency filter is not inserted, the current path being either the current path between the switching element and the smoothing capacitor or the current path between the bypass capacitor and the switching element, and having a stop band that is the operating frequency band of the antenna element.

13. The wireless communication module according to claim 6, further comprising:
    another frequency filter inserted in series in a current path in which the frequency filter is not inserted, the current path being either the current path between the switching element and the smoothing capacitor or the current path between the bypass capacitor and the switching element, and having a stop band that is the operating frequency band of the antenna element.

14. The wireless communication module according to claim 7, further comprising:
    another frequency filter inserted in series in a current path in which the frequency filter is not inserted, the current path being either the current path between the switching element and the smoothing capacitor or the current path between the bypass capacitor and the switching element, and having a stop band that is the operating frequency band of the antenna element.

15. The wireless communication module according to claim 8, further comprising:
    another frequency filter inserted in series in a current path in which the frequency filter is not inserted, the current path being either the current path between the switching element and the smoothing capacitor or the current path between the bypass capacitor and the switching element, and having a stop band that is the operating frequency band of the antenna element.

16. The wireless communication module according to claim 9, further comprising:

another frequency filter inserted in series in a current path in which the frequency filter is not inserted, the current path being either the current path between the switching element and the smoothing capacitor or the current path between the bypass capacitor and the switching element, and having a stop band that is the operating frequency band of the antenna element.

17. The wireless communication module according to claim 1, wherein the antenna element is located downstream of the output terminal.

\* \* \* \* \*